(12) United States Patent
Nishio et al.

(10) Patent No.: US 6,913,812 B2
(45) Date of Patent: Jul. 5, 2005

(54) RELEASING LAMINATED FILM

(75) Inventors: Yoshihiko Nishio, Shiga (JP);
Takanobu Suzuki, Shiga (JP)

(73) Assignee: Mitsubishi Plastics, Inc., Tokyo (JP)

( * ) Notice: Subject to any disclaimer, the term of this patent is extended or adjusted under 35 U.S.C. 154(b) by 0 days.

(21) Appl. No.: 10/851,063

(22) Filed: May 21, 2004

(65) Prior Publication Data

US 2004/0213969 A1 Oct. 28, 2004

Related U.S. Application Data

(63) Continuation of application No. 10/070,600, filed as application No. PCT/JP00/05928 on Aug. 31, 2000, now Pat. No. 6,790,510.

(30) Foreign Application Priority Data

Aug. 31, 1999 (JP) ............................................ 11-246662
Aug. 30, 2000 (JP) ........................................ 2000-260208
Aug. 30, 2000 (JP) ........................................ 2000-260209

(51) Int. Cl.$^7$ ..................... B32B 27/08; B32B 27/36; B32B 33/00
(52) U.S. Cl. ....................... 428/141; 428/215; 428/337; 428/421; 428/480
(58) Field of Search ................................. 428/215, 141, 428/337, 421, 480

(56) References Cited

U.S. PATENT DOCUMENTS

| | | | |
|---|---|---|---|
| 4,857,400 A | 8/1989 | Kloss, Jr. ..................... | 428/334 |
| 5,139,878 A | 8/1992 | Kim et al. ................... | 428/421 |
| 5,533,452 A | 7/1996 | Mouri et al. .............. | 101/463.1 |

FOREIGN PATENT DOCUMENTS

| | | |
|---|---|---|
| EP | 0 132 583 | 2/1985 |
| JP | 03159739 | 9/1991 |
| JP | 05-283862 | 10/1993 |
| JP | 08048004 | 2/1996 |

*Primary Examiner*—Ramsey Zacharia
(74) *Attorney, Agent, or Firm*—Pitney Hardin LLP

(57) ABSTRACT

A releasing laminated film is provided, which film comprises a supporting film having a tensile modulus of elasticity in a traverse direction measured according to ASTM D882 of 980 to 6,860 N/mm$^2$ and at least one film comprising a fluororesin laminated on at least one side of the supporting film. The releasing film is suitably used for producing a multilayered printed circuit board and a coating film.

4 Claims, No Drawings

RELEASING LAMINATED FILM

This application is a continuation of application Ser. No. 10/070,600 filed Feb. 28, 2002, which issued as U.S. Pat. No. 6,790,510 on Sep. 14, 2004 which is a 371 of PCT/JP00/05928 filed Aug. 31, 2000, and is herein incorporated by reference.

FIELD OF THE INVENTION

The present invention relates to a laminated film having a releasing property, specifically to a releasing film suitable for manufacturing a multilayered printed circuit board and to a carrier film for manufacturing a coating film.

DESCRIPTION OF THE PRIOR ART

A releasing laminated film is used as a releasing film for making multilayered printed circuit boards or for embossing leather grains on synthetic leather. It is also used as a carrier film for producing a coating film, or as a protective film for protecting a tacky or adhesive film from dusts, which protective film is peeled from the tacky or adhesive film immediately before using them.

A multilayered printed circuit board is produced by stacking a plurality of printed circuit boards with prepregs inserted therebetween, and sandwiching the deck of circuit boards thus obtained with releasing films and, then, hot pressing the deck to melt the prepregs, followed by hardening the prepregs to integrate the deck. As the releasing film, a fluororesin film is used, for example, poly(vinyl fluoride) film at a temperature of 175° C. or lower, tetrafluoroethylene-hexafluoropropylene copolymer (FEP), or tetrafluoroethylene-perfluoroalkylvinylether copolymer (PFA) at a temperature higher than 175° C.

There is such a problem concerning printed circuit boards having blind through-holes that a portion of molten prepregs bleeds out through openings of the through-holes of the topmost board upon hot-pressed and hardens on copper foil to thereby prevent the copper foil to be etched off, so that an accurate circuit may not be formed on the circuit board surface. To solve this problem, a thicker releasing film having a thickness of 0.06 to 0.3 mm than conventional films is used as described in Japanese Patent Application Laid-open H5-283862. However, such a thick film of the aforesaid fluororesin such as poly(vinyl fluoride) is generally expensive to raise production costs, which offsets an effect of decrease in a defection rate of the printed circuit boards. In addition, the fluororesin films such as poly(vinyl fluoride) film inherently have low stiffness or lack firmness.

Another problem with the conventional films is that they have poor handling property when placed on the printed circuit boards.

In addition, if there is a foreign body between a hot press plate or an embossing role and a releasing film when pressure is applied, a shape of the foreign body is transferred to cause a dent or mark on a circuit board surface through the releasing film due to the film's insufficient firmness. Such a dent may cause an inaccuracy in a circuit or embossed pattern.

Moreover, conventional releasing films are difficult to peel off from a press plate. A portion of the film sticks and remains on the press plate to obstruct successive production of circuit boards.

Thus, an object of the present invention is to provide a releasing film without the aforesaid problems.

The present invention also provides a carrier film for a coating film. The carrier film is used as a supporting film to make the coating film. To form a coating film with a uniform thickness, the carrier film must have a uniform thickness, too. After a coating film is formed by casting a resin on the carrier film, the carrier film is peeled from the coating film. Therefore, the carrier film is required to have a good releasing property. As the carrier film, a fluororesin film or biaxially drawn polyethylene terephthalate (PET) film with a silicone compound coated thereon is hitherto mainly used.

However, as mentioned above, a fluororesin is generally expensive. Therefore, a film thereof is preferably thin from an economical viewpoint, but at the same time it should not be too thin to have poor handling property. A fluororesin film thick enough to have a satisfactory handling property tends to have poor precision of thickness. This causes a problem that thickness of a coating film formed on the fluororesin film is not uniform.

Further, the fluororesin has poor mechanical strength such as tensile strength and may be torn when stretched in a coating process line. Meanwhile, a PET film coated with a silicon compound has a disadvantage that a coating film formed thereon is contaminated with the silicone compound.

Thus, an object of the present invention is to provide a carrier film for a coating film without the aforesaid problems.

SUMMARY OF THE INVENTION

The present invention is a releasing laminated film comprising a supporting film having a tensile modulus of elasticity in a traverse direction measured according to ASTM D882 of 980 to 6,860 N/mm$^2$ and at least one film comprising a fluororesin laminated on at least one side of the supporting film.

Further, the present invention is a releasing laminated film comprising a supporting film having a tensile modulus of elasticity in a traverse direction measured according to ASTM D882 of 980 to 6,860 N/mm$^2$ and a film comprising a fluororesin laminated on one side of the supporting film, the other side of the supporting film having a 10-point averaged surface roughness (Rz) of 3.0 to 8.0 μm and the number of peaks (Pc) of 200 to 400 measured according to JIS B0 601.

Preferably, said Rz is 4.0 to 7.0 μm and said Pc is 250 to 350.

Preferably, said tensile modulus of elasticity in a traverse direction is in a range of from 2,940 to 5,880 N/mm$^2$.

In the preferred embodiments, the fluororesin is tetrafluoroethylene-ethylene copolymer resin and the film comprising the fluororesin has a thickness of 1 to 50 μm; the supporting film has a melting point of 110° C. or higher; and the supporting film is a polyester film having a thickness of 5 to 1,000 μm.

The present invention also provides a laminated carrier film comprising a drawn polyester film and a film comprising a fluororesin laminated on at least one side of the drawn polyester film, the carrier film having a difference between a maximum thickness and a minimum thickness (R) of 5 μm or smaller, wherein R is measured along a 10 cm-long line starting at an arbitrary point on a surface of the laminated film with a continuous-mode thickness meter provided with a tip having a diameter of 5 mm.

In the preferred embodiments, said R is 3 μm or smaller; the drawn polyester film is a polyethylene terephthalate film having a thickness of 5 to 1000 μm; and the film comprising a fluororesin is a tetrafluoroethylene-ethylene copolymer film having a thickness of 2 to 10 μm.

In the films described above, it is preferred that the film comprising a fluororesin is dry laminated on the supporting film.

Preferably, in the films described above, a polyethylene film, polypropylene film, or polyester film is further laminated on the film comprising a fluororesin.

Preferably, the film described above has a total thickness of 10 to 300 μm, more preferably 60 to 300 μm.

DESCRIPTION OF THE PREFERRED EMBODIMENTS

As the supporting film used in the present releasing film, any known films can be used. Examples of such include films of polyester, polycarbonate, triacetylcellulose, cellophane, polyamide, aromatic polyamide, polyimide, polyetherimide, polyphenylenesulfide, polysulfone, polyethersulfone, polypropylene, and high density polyethylene. Among these, a polyethylene film is preferred in terms of thermal property, mechanical properties, and price.

The supporting film has a tensile modulus of elasticity in a traverse direction, i.e., a direction perpendicular to a machine direction (film stream direction) of 980 to 6,860 $N/mm^2$, preferably 2,940 to 5,880 $N/mm^2$, more preferably 3,430 to 5,390 $N/mm^2$. If the tensile modulus of elasticity is below the aforesaid lower limit, the releasing film has a worse handling property. For example, the film creases in handling. On the other hand, the releasing film is too hard to handle, if the tensile modulus of elasticity exceeds the aforesaid upper limit.

The present invention relates also to a releasing film comprising a supporting film and a fluororesin film laminated thereon, wherein the supporting film surface opposite to the surface laminated with the fluororesin film has a 10-points averaged surface roughness (Rz) of 3.0 μm to 8.0 μm and the number of peaks (Pc) of 200 to 400, both measured by a tracer method according to the Japanese Industrial Standards (JIS) B0 601. If Rz is smaller than 3.0 μm or Pc is smaller than 200, the film adheres to a press plate too well and is not easily peeled from the press plate. Preferably, Rz is in a range of from 4.0 μm to 7.0 μm and Pc is in a range of from 250 to 350.

The aforesaid surface roughness can be attained by treating a surface of the supporting film by sand matting, incorporating a filler in the film, or chemical matting.

In the releasing film used for a multilayered printed circuit board, or an emboss role, the supporting film preferably has a melting point of 110° C. or higher, more preferably 200° C. or higher. If the melting point is below 110° C., heat resistance of the releasing film is so low as to cause the releasing film to adhere to a press plate.

The supporting film has a thickness of 5 to 1,000 μm, preferably 12.5 to 300 μm, more preferably 25 to 100 μm. If the thickness is smaller than the aforesaid lower limit, dents or bleedout tends to occur. If the thickness is larger than the aforesaid upper limit, precision of the thickness of a laminated film is lower, so that pressure may not be uniformly applied in the pressing. Further, manufacturing costs and the amount of waste are larger.

In the present releasing film, use may be made of a fluororesin such as poly(tetrafluoroethylene) (PTFE), tetrafluoroethylene-perfluorovinylether copolymer (PFA), tetrafluoroethylene-ethylene copolymer (ETFE), tetrafluoroethylene-hexafluoropropylene copolymer (FEP), poly(chlorotrifluoroethylene) (CTFE), and poly(vinylidene fluoride) (VdF). When a pressing temperature is 175° C. or lower, VdF is preferred. When a pressing temperature is higher than 175° C., FEP and PFA are preferred.

The fluororesin film has a thickness of 1 to 50 μm, preferably 2 to 30 μm, most preferably 3 to 20 μm.

The present invention relates also to a carrier film for manufacturing a coating film. The carrier film has such a thickness that a difference between a maximum thickness and a minimum thickness (R) is 5 μm or smaller, measured along a 10 cm-long line starting at an arbitrary point on a surface of the film with a continuous-mode thickness meter provided with a tip having a diameter of 5 mm. The film having such good precision of thickness allows one to produce a coating film having a uniform thickness. Preferably, R is 3 μm or smaller.

Generally, it is difficult to attain R of 5 μm or smaller in a fluororesin film. On the contrary, a drawn polyester film usually has R of 1 to 2 μm. By laminating a thin fluororesin film on a polyester film having a good precision of thickness, the present invention provides a carrier film having good precision of thickness, economical efficiency and handling property.

As the polyester film used in the present carrier film, any known films can be used. Examples of such include films of polyethylene terephthalate, polyethylene naphthalate, polyethylene isophthalate, and polybutylene terephthalate. Among these, polyethylene terephthalate is preferred because of its good precision of thickness, thermal property, mechanical properties, and lower price.

The polyester film has a thickness of 5 to 300 μm, preferably 25 to 100 μm. If the thickness is smaller than the aforesaid lower limit, handling property of the carrier film is worse. If it is larger than the aforesaid upper limit, thickness precision of the polyester film is too low to make a carrier film having desired precision of thickness and, in addition, manufacturing costs and the amount of waste may increase.

As the fluororesin used in the present carrier film, any one of the aforementioned fluororesins to be used for the present releasing film can be used. The fluororesin film preferably has a thickness of 2 to 10 μm, more preferably 3 to 5 μm.

The present releasing films and the carrier film preferably have a total thickness of 10 to 400 μm, particularly 60 to 300 μm.

The present releasing film may be prepared by dry laminating the fluororesin film on one side of the supporting film. As an adhesive for dry laminating, use may be made of acryl-modified adhesives, isocyanate adhesives, polyethylene imine adhesives, polyurethane adhesives, or silane coupling agents. Among these, polyurethane adhesives for dry laminating are preferred. Preferably, the surface of the supporting film and the surface of the fluororesin film are treated by corona discharge prior to the dry laminating. To prepare the thin fluororesin film, the fluororesin may be co-extruded together with a polyolefin resin, or may be extruded on a transfer film and wound together. After dry laminating the thin fluororesin film on the polyester film, the co-extruded polyolefine film or the transfer film may be peeled off.

Preferably, a protective film layer, e.g., polyethylene film, is provided on the fluororesin film surface opposite to the surface laminated with the supporting film. By peeling the protective film immediately before placing the carrier film on a metal base plate, one can keep dust away to provide a coating film with higher thickness precision. As the protective film, any film which can stick to the fluororesin film may be used. Examples of such include films of various types of polyethylene, polypropylene, polyester, poly(vinyl chloride), triacetylcellulose, cellophane, polyamide, polycarbonate, aromatic polyamide, polyimide, polyetherimide, polyphenylenesulfide, polysulfone, and polyethersulfone. Among these, a high density polyethylene film is preferred because of its lower price. The protective film preferably has a thickness of 10 to 50 μm. The protective film may be laminated on the fluororesin film by hot pressing.

EXAMPLES

A. Releasing Film (1)

Films and Prepregs Used

Polyethylene terephthalate (PET) films: ex Mitsubishi Chemical Co., 25 μm thick or 95 μm thick, both having a tensile modulus of elasticity in the traverse direction of 5000 N/mm$^2$.

Tetrafluoroethylene-ethylene copolymer (ETFE) films: a 5 μm thick film was produced from an ETFE resin of Asahi Glass Co.; 12.5 μm thick ready-made film, ex Asahi Glass Co.; and 100 μm thick ready-made film, ex Asahi Glass Co.

High density polyethylene (HDPE) film: 15 μm thick, ex Mitsubishi Chemical Polyester Co.

Prepreg: epoxy resin-impregnated glass cloth, ex Mitsubishi Gas Chemical Co.

Methods for Evaluation

1. Dents

Several pieces of a 5 μm-cube glass dust were placed between a releasing film and a press plate, and hot pressing was carried out. Then, the releasing film was peeled off from a surface of a circuit board, which surface was then visually observed for dents. When no dent was observed, the releasing film was rated as double circle ⊚; when slightly observed, ○; and when clearly observed, X.

2. Bleedout of Prepreg

After hot pressing, a releasing film was peeled off and the area surrounding blind through-holes was visually observed. When bleedout was not observed at all, the releasing film was rated as ○; and when observed, X.

3. Handling Property

A releasing film which could be easily set on a circuit board without creasing was rated as ⊚; with creasing a little, ○; and a film which was difficult to handle to be creased, X.

4. Costs

Roughly estimated production cost of each film is as shown in Table 1, relative to that of the film of Comparative Example A-1 taken as 100.

5. Releasing Property

A releasing film was placed on a circuit board. The film that could be easily peeled off by hand was rated as ○; and not peeled off by hand, X.

EXAMPLES A-1 to A-3 and Comparative Examples A-1 to A-3

Releasing films were prepared by dry laminating each fluororesin film shown in Table 1 on a polyester film. In Example A-2, a protective film made of HDPE was further laminated by heat pressing on the fluororesin film. Two printed circuit boards having blind through-holes were stacked, sandwitching a prepreg between the boards. A releasing film was placed on the top of the deck of the printed circuit boards, and another film at the bottom. A few pieces of about 5 μm-cube glass dust taken from an epoxy resin-impregnated glass cloth were placed at a center part of the upper releasing film. Then, the deck of the printed circuit boards was hot pressed at 170° C. and 50 kgf/cm$^2$ for 60 minutes to melt and harden the prepreg to integrate the deck of the printed circuit boards. In Example A-2, the protective film of the releasing film was peeled off before placing the releasing film on the printed circuit board.

In Comparative Example A-3, a polyester film coated with silicone was used.

The results of the valuation are as shown in Table 1.

TABLE 1

| | Film Structure | Dent | Bleedout | Handling Property | Production Cost | Releasing Property |
|---|---|---|---|---|---|---|
| Example A-1 | PET (95 μm)/ETFE(5 μm) | ⊚ | ○ | ⊚ | 30 | ○ |
| Example A-2 | PET(95 μm)/ETFE(5 μm)/HDPE(15 μm) | ⊚ | ○ | ⊚ | 45 | ○ |
| Example A-3 | PET(25 μm)/ETFE(5 μm) | ○ | x | ○ | 20 | ○ |
| Comparative Example A-1 | ETFE(100 μm) | ○ | ○ | x | 100 | ○ |
| Comparative Example A-2 | ETFE(12.5 μm) | x | x | x | 15 | ○ |
| Comparative Example A-3 | PET (95 μm)/silicone coating | ○ | ○ | ⊚ | 10 | x |

The films of Example A-1 and A-2 are superior to that of Comparative Example A-1 in that they caused no dents, had better handling property and lower production costs. The film of Example A-3 showed bleedout, but had good handling property enough to be used as a protective film for an adhesive film. On the other hand, the films of Comparative Example 1 and Comparative Example 2 had worse handling property and were difficult to set on the printed circuit boards.

B. Releasing Film (2)

Films and Prepregs Used

Polyethylene terephthalate (PET) film: ex Mitsubishi Chemical Co., 50 μm thick, having tensile modulus of elasticity in the traverse direction of 5000 N/mm$^2$.

Tetrafluoroethylene-ethylene copolymer (ETFE) film: 5 μm thick, made of an ETFE resin of Asahi Glass Co.

Prepreg: epoxy resin-impregnated glass cloth, ex Mitsubishi Gas Chemical Co.

Measurement of Surface Roughness

Surface roughness was measured according to JIS B0 601 with a surface roughness tester, SE-3 FK, ex Kosaka Laboratory Ltd., provided with a tip with a radius of 2 μm, under a 70 mg load.

Preparation of Releasing Laminated Films

One surface of the PET film was provided with embossed pattern by sand blasting so as to have a surface roughness shown in Table 2. Then, on the surface opposite to the sand blasted surface, the ETFE film was dry laminated to prepare the laminated films shown in Table 2.

Two printed circuit boards having blind through-holes were stacked, sandwitching a prepreg between the boards. A releasing film was placed on the top of the deck of the printed circuit boards, and another film at the bottom. The deck of the printed circuit boards thus sandwiched between the releasing films was hot pressed with a mirror-finished press plate at170° C. and 490 N/cm² to melt and harden the Prepreg to integrate the deck. After 60 minutes, the pressure was released to take out the integrated circuit board. The following evaluation was carried out. The results are as shown in Table 3.

(1) Peeling-off of the Releasing Film from the Press Plate

The releasing film which was peeled off from the press plate without leaving any portion of the film stuck to the press plate was rated as ○; one which could be peeled with a portion remaining stuck to the press plate, Δ; and one which was difficult to peel off, leaving more than about a half of it stuck to the press plate, X.

(2) Transfer of the Embossed Pattern of the Supporting Film to the Circuit Board After peeling the releasing film from a printed circuit board, the surface of the printed circuit board was examined whether the embossed pattern of the releasing film was transferred there or not.

TABLE 2

|  | Film Structure | Rz(μm) | Pc(counts) |
|---|---|---|---|
| Example B-1 | PET (50 μm)/ETFE(5 μm) | 4.5 | 320 |
| Example B-2 | " | 3.0 | 400 |
| Reference Example B-1 | " | 4.5 | 170 |
| Reference Example B-2 | " | 2.0 | 400 |
| Reference Example B-3 | " | 15.0 | 200 |
| Reference Example B-4 | " | 0.7 | 25 |

TABLE 3

|  | Release from Press Plate | Transfer |
|---|---|---|
| Example B-1 | ○ | No |
| Example B-2 | ○ | No |
| Reference Example B-1 | Δ | No |
| Reference Example B-2 | Δ | No |
| Reference Example B-3 | Δ | Yes |
| Reference Example B-4 | x | No |

All of the films of the present invention were peeled off well from the printed circuit board. On the other hand, the films of Reference Examples B-1 to B-3 were worse in the releasing property than the films of the present invention.

C. Carrier Film

Films Used

Polyethylene terephthalate (PET) films: ex Mitsubishi Chemical Co., 50 μm thick or 100 μm thick, both having a tensile modulus of elasticity in the traverse direction of 5000 N/mm².

Tetrafluoroethylene-ethylene copolymer (ETFE) films: 3 μm thick made of a ETFE resin of Asahi Glass Co.; 50 μm thick ready-made film, ex Asahi Glass Co.; and 100 μm thick ready-made film, ex Asahi Glass Co.

Silicon coated PET film: MRE (trade mark, silicone coated type), 50 μm thick, ex Mitsubishi Chemical Polyester Film Co.

Thickness Difference R Measurement

Thickness difference of a film was determined by continuously measuring thickness of the film over 10 cm along the machine direction with a FILM THICKNESS TESTER, ex Anritsu Co., provided with tip of 5 mm in diameter. The measurement was repeated at 10 locations at intervals of 1 centimeter along a direction perpendicular to the machine direction and the results were averaged. Thickness in a direction perpendicular to the machine direction was also measured over 10 cm in a similar manner as described above and the results were averaged.

Preparation of Carrier Films

The carrier films shown in Table 4 were prepared by dry laminating an ETFE film on a PET film.

(1) Each carrier film was measured for R. The carrier film having R of 5 μm or smaller was rated as ○; and one having R greater than 5 μm, X.

(2) A 30 μm thick coating film of a polyimide resin was formed on each carrier film and the following evaluation was made according to the following criteria for handling property in the casting of polyimide, releasing property after forming the coating film, R of the coating film, and contamination on the coating film surface. The results are as shown in Table 4.

a. Handling Property

The carrier film which was easy to handle without creasing was rated as ○; one showed a few creases, Δ; and one which was creasy and difficult to handle, X.

b. Releasing Property

The carrier film which could be easily peeled off by hand was rated as ○.

c. Thickness Difference (R) of the Coating Film

Each coating film was measured for R. The one having R of 5 μm or smaller was rated as ○; and one having a R greater than 5 μm, X.

d. Contamination on the Coating Film Surface

The surface of the coating film was visually observed for contamination. When contamination is found, the carrier film was rated as X; and when not found, ○.

TABLE 4

|  | Film Structure | R | Handling Property | Releasing Property | R of Coating Film | Contamination on Coating Film |
|---|---|---|---|---|---|---|
| Example C-1 | PET (50 μm)/ETFE(3 μm) | ○ | ○ | ○ | ○ | ○ |
| Example C-2 | PET (100 μm)/ETFE(3 μm) | ○ | ○ | ○ | ○ | ○ |
| Comparative Example C-1 | ETFE (50 μm) | x | x | ○ | x | ○ |
| Comparative Example C-2 | ETFE (100 μm) | x | Δ | ○ | x | ○ |

TABLE 4-continued

| | Film Structure | R | Handling Property | Releasing Property | R of Coating Film | Contamination on Coating Film |
|---|---|---|---|---|---|---|
| Comparative Example C-3 | silicon coated PET(50 μm) | ○ | ○ | ○ | ○ | x |

INDUSTRIAL APPLICABILITY

The present releasing laminated film has a good handling property, and is capable of preventing bleedout of a molten prepreg and occurrence of dents in the production of multilayered circuit boards.

The present releasing laminated film is well peeled off not only from a prepreg but also from a press plate.

The present carrier film has a good handling property, and releasing property. By using the carrier film, a coating film can be formed with a good thickness precision and without contamination.

What is claimed is:

1. A laminated carrier film comprising a drawn polyester film having a thickness of 5 to 300 μm and a film comprising a fluororesin laminated directly onto at least one side of the drawn polyester film, the carrier film having a difference between a maximum thickness and a minimum thickness (R) of 5 μm or smaller, wherein R is measured along a 10 cm-long line starting at an arbitrary point on a surface of the laminated film with a continuous-mode thickness meter provided with a tip having a diameter of 5 mm.

2. The carrier film according to claim 1, where R is 3 μm or smaller.

3. The carrier film according to claim 1, wherein the drawn polyester film is a polyethylene terephthalate film having a thickness to 5 to 100 μm.

4. The carrier film according to claim 1, wherein the film comprising a fluororesin is a tetrafluoroethylene-ethylene copolymer film having a thickness of 2 to 10 μm.

* * * * *